(12) United States Patent
Weiss et al.

(10) Patent No.: US 9,143,123 B2
(45) Date of Patent: Sep. 22, 2015

(54) RF SWITCH, MOBILE COMMUNICATION DEVICE AND METHOD FOR SWITCHING AN RF SIGNAL

(75) Inventors: Franz Weiss, Munich (DE); Hans Taddiken, Munich (DE); Nikolay Ilkov, Munich (DE); Winfried Bakalski, Munich (DE); Jochen Essel, Munich (DE); Herbert Kebinger, Mettenheim (DE)

(73) Assignee: Infineon Technologies AG, Neubiberg (DE)

( * ) Notice: Subject to any disclaimer, the term of this patent is extended or adjusted under 35 U.S.C. 154(b) by 641 days.

(21) Appl. No.: 13/545,822

(22) Filed: Jul. 10, 2012

(65) Prior Publication Data
US 2014/0015593 A1    Jan. 16, 2014

(51) Int. Cl.
*H03K 17/56* (2006.01)
*H03K 17/687* (2006.01)
*H03K 17/10* (2006.01)
*H03K 17/693* (2006.01)

(52) U.S. Cl.
CPC ............ *H03K 17/102* (2013.01); *H03K 17/693* (2013.01)

(58) Field of Classification Search
CPC ............ H03K 17/08; H03K 17/08104; H03K 17/08122; H03K 17/102; H03K 17/693
USPC .................................................. 327/419, 434
See application file for complete search history.

(56) References Cited

U.S. PATENT DOCUMENTS

| | | | |
|---|---|---|---|
| 6,455,894 B1 * | 9/2002 | Matsumoto et al. | 257/347 |
| 7,893,518 B2 | 2/2011 | Krauss | |
| 8,319,289 B2 | 11/2012 | Shiraishi et al. | |
| 2011/0294444 A1 | 12/2011 | Kawano | |
| 2013/0334609 A1 * | 12/2013 | Deguchi et al. | 257/368 |

FOREIGN PATENT DOCUMENTS

| | | |
|---|---|---|
| DE | 102008020452 A1 | 11/2008 |
| JP | 2000341105 A | 12/2000 |
| JP | 4601603 B2 | 12/2010 |
| JP | 2011249485 A | 12/2011 |
| WO | 2009037808 A1 | 3/2009 |

* cited by examiner

*Primary Examiner* — William Hernandez
(74) *Attorney, Agent, or Firm* — Slater & Matsil, L.L.P.

(57) ABSTRACT

An RF switch includes a switchable RF transistor. The switchable RF transistor includes a stripe of a plurality of adjacent RF transistor fingers and at least one non-switchable dummy transistor that is arranged at an end of the stripe of the switchable RF transistor.

27 Claims, 13 Drawing Sheets

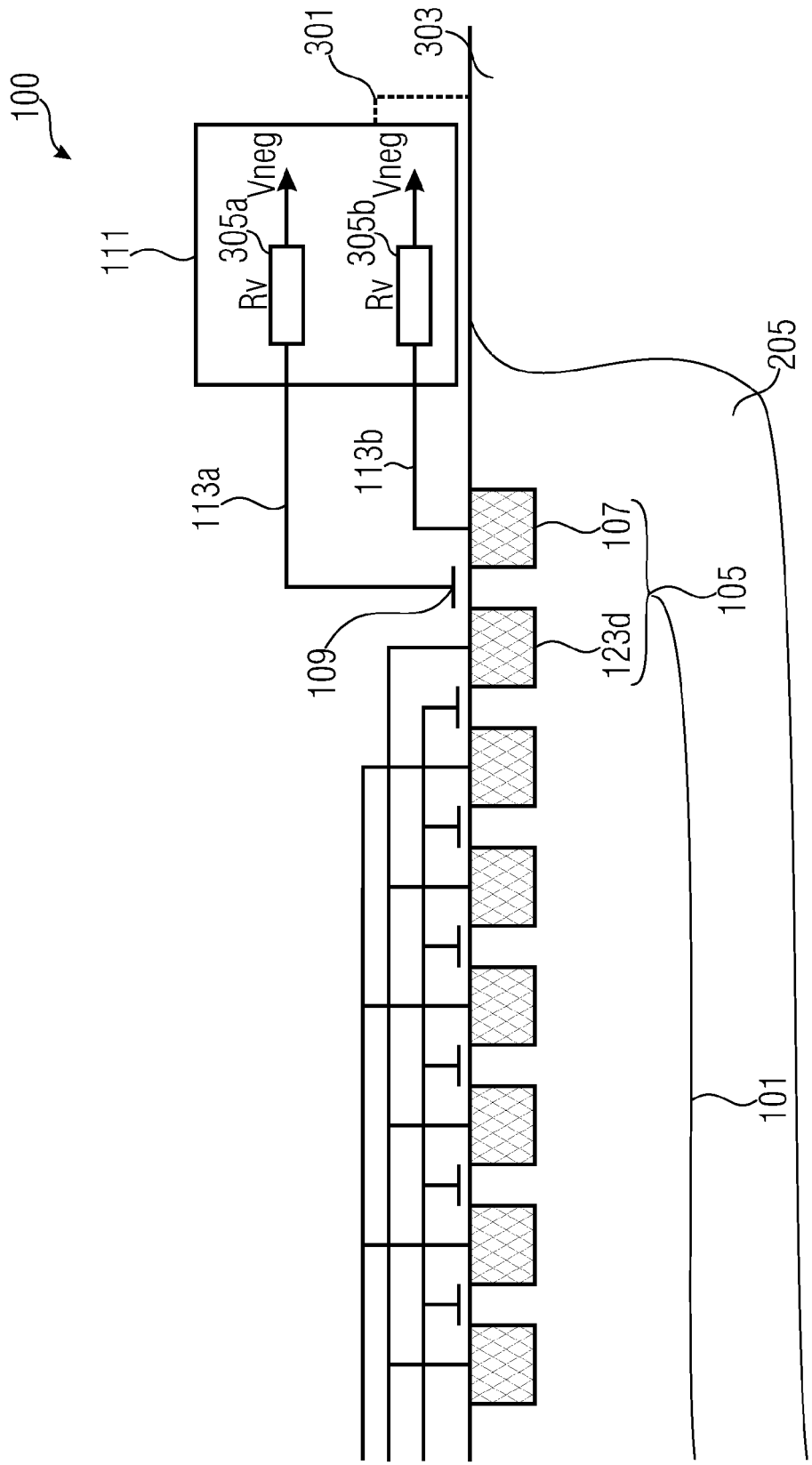

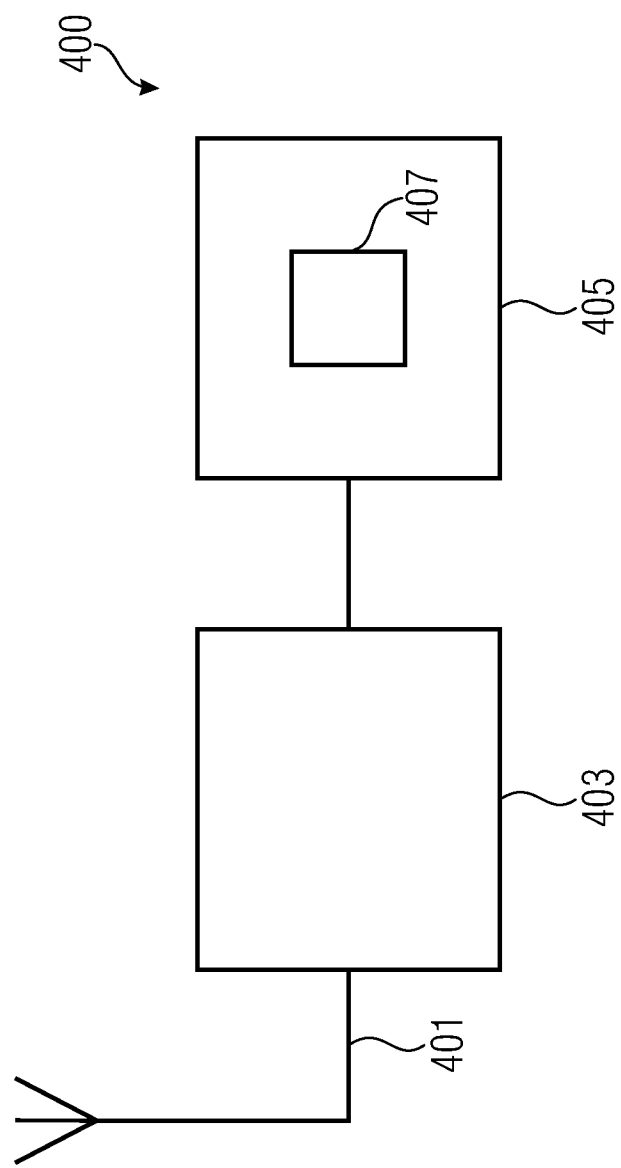

RF SWITCH, MOBILE COMMUNICATION DEVICE AND METHOD FOR SWITCHING AN RF SIGNAL

TECHNICAL FIELD

Embodiments of the present invention relate to an RF switch. Further embodiments of the present invention relate to a mobile communication device comprising such an RF switch. Further embodiments of the present invention relate to a method for switching an RF signal.

BACKGROUND

In high frequency switches for the mobile radio sector, frequently very high RF amplitudes occur, resulting in reliability problems and high generation of harmonics. The design of an RF switch considers these high amplitudes with different measures. RF transistors in high frequency switches or in RF switches typically have to be designed with very large width. This results in a large number of transistor fingers. Typically between the transistor fingers, the RF voltages are of a similar amount and hence the field strengths are low. Nevertheless, the transistor fingers at an edge, in particular the outermost diffusion region, experiences very high field strengths. As an example, a full RF voltage in an outermost diffusion region is opposed by an RF voltage of zero volt in the adjacent substrate. Naturally, this leads to very high field strengths, high stress at this location and damages of the RF transistors.

SUMMARY OF THE INVENTION

Embodiments of the present invention relate to an RF switch comprising a switchable RF transistor, wherein the switchable RF transistor comprises a stripe of a plurality of adjacent RF transistor fingers. Furthermore, the RF switch comprises at least one non-switchable dummy transistor which is arranged at an end of the stripe of the switchable RF transistor.

Further embodiments of the present invention relate to a method for switching an RF signal using an RF switch, a method for producing an RF switch and a mobile communication device comprising an RF switch.

BRIEF DESCRIPTION OF THE DRAWINGS

Embodiments of the present invention will be described in more detail using the accompanying figures in which:

FIG. 2b shows an enlarged section of one of the RF transistors from the RF switch shown in FIG. 2a;

FIGS. 3a to 3d show RF switches according to embodiments of the present invention with different implementations for a termination circuit for non-switchable dummy transistors;

FIG. 4 shows a block schematic diagram of a mobile communication device according to an embodiment of the present invention;

DETAILED DESCRIPTION OF ILLUSTRATIVE EMBODIMENTS

Before embodiments of the present invention will be described in detail using the accompanying figures, it is to be pointed out the same or functionally equal elements are given the same reference numbers in the figures and that a repeated description for elements provided with the same reference numbers is omitted. Hence, description provided for elements having the same reference numbers are mutually exchangeable.

In the present application a coupling between two terminals should be understood as a direct low ohmic coupling or an indirect coupling with one or more elements between, such that a signal at a second node is dependent on a signal at a first node, which is coupled to the second node. Between two coupled terminals a further element may be coupled, but not necessarily need to be, such that two terminals which are coupled to each other may be also directly connected to each other (e.g., by means of a low impedance connection, such as a wire or a wire trace).

Furthermore, according to the present application a first terminal is directly connected to a second terminal, if a signal at the second terminal is equal to a signal at the first terminal, wherein parasitic effects or minor losses due to conductor resistances shall not be regarded. In other words, two terminals which are directly connected to each other are typically connected by means of wire traces or wires without additional elements in between.

In the present application, a first terminal of a transistor may be a source terminal or an emitter terminal of the transistor or a drain terminal or a collector terminal of the transistor. A second terminal of the transistor may be a drain terminal or a collector terminal of the transistor or may be a source terminal or an emitter terminal of the transistor. A control terminal of the transistor may be a gate terminal or a base terminal of the transistor. Therefore, a switchable path of a transistor may be a drain source path or an emitter collector path of the transistor. A main transistor current is typically routed from the first terminal to the second terminal of the transistor or vice versa.

Furthermore two nodes or terminals are electrically coupled if a coupling path (e.g., a switchable path of a transistor) between the two coupled nodes or terminals is in a low impedance state and are electrically decoupled if the coupling path is in a high impedance state.

Figure 1A:
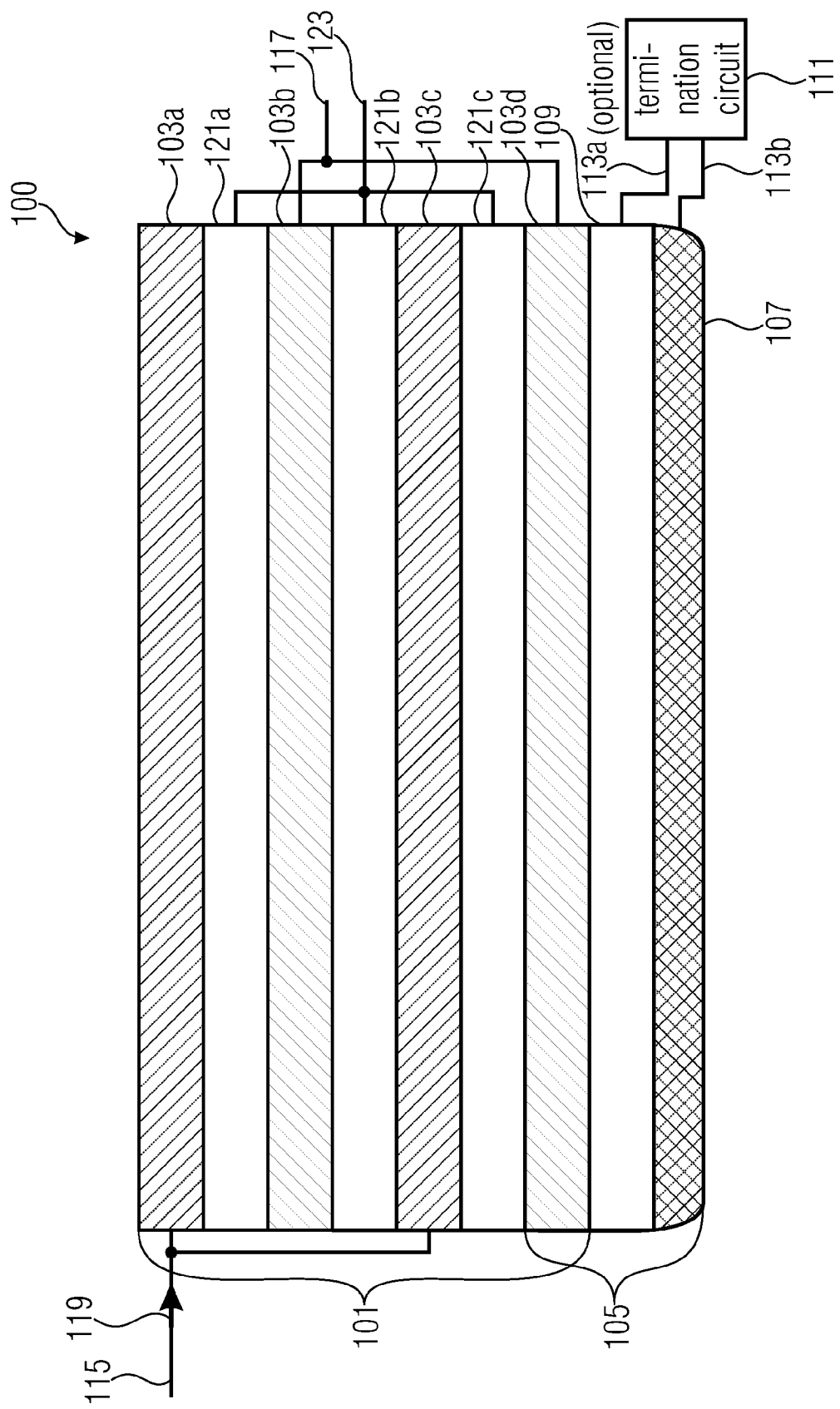
FIG. 1a shows an RF switch according to an embodiment of the present invention.

FIG. 1a shows (in a top view perspective) an RF switch 100 according to an embodiment of the present invention.

The RF switch 100 comprises a switchable RF transistor 101. The switchable RF transistor 101 comprises a stripe of a plurality of adjacent RF transistor fingers 103a to 103d. Furthermore, the RF switch 100 comprises at least one non-switchable dummy transistor 105 which is arranged at an end of the stripe of the switchable RF transistor 101.

It has been found that between the RF transistor fingers 103a to 103d of the switchable RF transistor 101, the RF voltages are of a similar amount and hence the field strengths are low. Nevertheless, an RF transistor finger at the edge (in the example shown in FIG. 1a the fourth or last RF transistor finger 103d) or in particular the outermost diffusion region of the switchable RF transistor 101 experiences in conventional designs a very high field strength, as typically the full RF voltage in this outermost diffusion region (at the fourth RF transistor finger 103d) is opposed by an RF voltage of zero volt in the adjacent substrate. Naturally, in conventional designs this leads to very high field strengths, high stress at this location and failures.

It is a core idea of embodiments of the present invention that these failures can be prevented if, at the end of the stripe of the RF transistor 101 (and therefore next to the fourth RF transistor finger 103d, which can also be designated as last RF transistor finger 103d) the non-switchable dummy transistor 105 is arranged. By having the non-switchable dummy transistor 105 at the end of the stripe of the switchable RF transistor 101, the high RF voltage is distributed across the non-switchable dummy transistor 105 (e.g., across dummy transistor fingers of the non-switchable dummy transistor 105). Hence, embodiments of the present invention solve the problem of high field strengths occurring at edge transistor fingers in terms of circuit engineering by having the non-switchable dummy transistor 105 arranged at the end of the stripe of the switchable RF transistor 101. This results in the distribution of occurring field strengths across the dummy transistor fingers of the non-switchable dummy transistor 105. By reducing the field strengths the stress of the switchable RF transistor 101 is reduced and hence the robustness is increased. Furthermore, a reduction of the field strengths also reduces the generation of harmonics.

Furthermore, the RF switch 100 comprises the following additional features.

The RF switch 100 comprises a termination circuit 111 for providing a termination potential to the non-switchable dummy transistor 105 for retaining an impedance state of the non-switchable dummy transistor 105 (during an operation of the RF switch 100 so as to make the non-switchable dummy transistor 105 non-switchable).

In other words, the termination circuit 111 provides (at least) one termination potential to the non-switchable dummy transistor 105 such that in an operation of the RF switch 100 an impedance state of a switchable path of the non-switchable dummy transistor 105 stays constant (is not changed).

The fourth RF transistor finger 103d is arranged at the end of the stripe of the switchable RF transistor 101. Hence, the fourth RF transistor finger 103d is a last RF transistor finger 103d in the stripe of the switchable RF transistor 101.

Furthermore, the non-switchable dummy transistor 105 is formed by this fourth RF transistor finger 103d, a dummy transistor finger 107 and a dummy gate area or dummy control area 109 arranged between the fourth RF transistor finger 103d and the dummy transistor finger 107. Hence, the fourth RF transistor finger 103d is part of both, the switchable RF transistor 101 and the non-switchable dummy transistor 105. In other words, the switchable RF transistor 101 and the non-switchable dummy transistor 105 share the fourth RF transistor finger 103d.

Each of the RF transistor fingers 103a to 103d and even the dummy transistor finger 107 can be a diffusion region. Such a diffusion region is typically highly doped (for example highly p doped or highly n doped) when compared to a lowly doped gate area or substrate.

Hence, each of the RF transistor fingers 103a to 103d is part of a first terminal or second terminal of the RF transistor 101. Furthermore, the fourth RF transistor finger 103d forms or is part of a first terminal of the non-switchable dummy transistor 105. The dummy transistor finger 107 forms or is part of a second terminal of the non-switchable dummy transistor 105. The dummy gate area 111 forms or is part of a control terminal of the dummy transistor 105.

To summarize, the non-switchable dummy transistor 105 is formed by the last RF transistor finger 103d of the stripe, the dummy transistor finger 107 arranged adjacent to the last RF transistor finger 103d and the dummy gate area 111 arranged between the last RF transistor finger 103d and the dummy transistor finger 107. Furthermore, for retaining the impedance state of the non-switchable dummy transistor 105, the termination circuit 111 is configured to provide a first termination potential 113a to the dummy gate area 111 and a second termination potential 113b to the dummy transistor finger 107 for retaining an impedance state of the non-switchable dummy transistor 105.

The non-switchable dummy transistor 105 is arranged at the end of the stripe of the switchable RF transistor 101 in a direction in which the RF transistor fingers 103a to 103d are arranged adjacently in the stripe.

The termination circuit 111 is configured to provide the termination potential 113a, 113b such that (independent of a potential at the last RF transistor finger 103d) the impedance state (of the switchable path) of the non-switchable dummy transistor 105 is retained.

According to an embodiment of the present invention, the termination circuit 111 provides the termination potentials 113a, 113b such that during an operation of the RF switch 100 the switchable path of the non-switchable dummy transistor 105 is always in a high impedance state (e.g., non-conducting).

Furthermore, as the RF switch 100 can be used for switching an RF signal such that in a first switch state of the RF switch 100 the RF signal is routed along the RF switch 100 and in a second switch state of the RF switch 100 the RF signal not routed along the RF switch 100, the termination circuit 111 provides the termination potentials 113a, 113b such that independent of the current switch state of the RF switch 100 the impedance state of the non-switchable RF transistor 105 is (always) retained. Hence, even if an impedance state of the switchable RF transistor 101 is changed (e.g., from low impedance state to high impedance state or from high impedance state to low impedance state), the termination circuit 111 provides the termination potentials 113a, 113b such that the non-switchable dummy transistor 105 retains its impedance state (in the example shown in FIG. 1a such that the non-switchable dummy transistor 105 stays in the high impedance state).

According to some embodiments, the termination potentials 113a, 113b are fix potentials which are kept constant during the operation of the RF switch 100.

According to further embodiments the RF switch 100 can comprise further non-switchable dummy transistors which can be arranged adjacent to the non-switchable dummy transistor 105. The termination circuit 111 accordingly can be configured to provide a plurality of termination potentials to the non-switchable dummy transistors such that impedance states of the non-switchable dummy transistors are retained or stay constant during the operation of the RF switch 100.

The termination circuit 111 can be configured to provide the first termination potential 113a and the second termination potential 113b such that they are equal.

In the following, the structure of the RF switch 100 and especially of the switchable RF transistor 101 will be described in more detail.

The RF switch 100 comprises a first signal terminal 115 and a second signal terminal 117. The RF switch 100 is configured to switchably route an RF signal 119 from the first signal terminal 115 to the second signal terminal 117 or from the second signal terminal 117 to the first signal terminal 115.

As an example, in the above described first switch state of the RF switch 100 the RF switch 100 is configured to establish a low impedance connection between the first signal terminal 115 and the second signal terminal 117. In the second switch state of the RF switch 100, the RF switch 100 is configured to establish a high impedance connection between the first signal terminal 115 and the second signal terminal 117. Hence, in the first switch state of the RF switch 100, the RF signal 119 can be routed via the RF switch 100 while in the second switch state of the RF switch 100 the RF signal 119 cannot be routed via the RF switch 100.

For establishing the low impendence connection between the first signal terminal 115 and the second signal terminal 117, the RF switch 100 brings the switchable RF transistor 101 (or in more detail the switchable path of the switchable RF transistor 101) into a low impedance (conducting) state such that the RF signal 119 can be routed via the switchable path of the switchable RF transistor 101. For establishing the high impedance connection between the first signal terminal 115 and the second signal terminal 117 (or for electrically decoupling the first signal terminal 115 from the second signal terminal 117) the RF switch 100 brings the switchable RF transistor 101 (or in more detail the switchable path of the switchable RF transistor 101) into a high impedance (non-conducting) state.

According to further embodiments the RF switch 100 can comprise a plurality of such RF transistors which are coupled in series between the first signal terminal 115 and the second signal terminal 117. The RF switch 100 is configured to bring in the first switch state of the RF switch 100 switchable paths of the plurality of RF transistors into the low impedance state and in the second switch state of the RF switch 100 into the high impedance state.

As already described, the switchable RF transistor 101 comprises the plurality of RF transistor fingers 103a to 103d. Furthermore, each of the RF transistor fingers 103a to 103d of the switchable RF transistor 101 is shorted with a next-but-one in the stripe RF transistor finger 103a to 103d of the switchable transistor 101. As can be seen from FIG. 1a a first RF transistor finger 103a is shorted with a third transistor finger 103c. A second RF transistor finger 103b is shorted with the fourth RF transistor finger 103d. Hence, each shorted group of transistor fingers forms a terminal of the first RF transistor 101. As an example, the first RF transistor finger 103a the third RF transistor finger 103c form a first terminal of the switchable RF transistor 101 and the second RF transistor finger 103b and the fourth RF transistor finger 103d form a second terminal of the switchable RF transistor 101. The first terminal of the switchable RF transistor 101 is coupled to the first signal terminal 115 of the RF switch 100. The second terminal of the RF transistor 101 is coupled to the second signal terminal 117 of the RF switch 100.

Nevertheless, according to further embodiments of the present invention, the first terminal of the RF switch 101 can be coupled to a second terminal of a preceding switchable RF transistor of the RF switch 100 which is coupled in series with the switchable RF transistor 101. Furthermore, the second terminal of the switchable RF transistor 101 can be coupled to a first terminal of a succeeding switchable RF transistor of the RF switch 100 which is coupled in series with the switchable RF transistor 101.

Furthermore, the RF switch 100 comprises a plurality of RF gate areas 121a to 121c. Each of the RF gate areas 121a to 121c is arranged between two adjacent RF transistor fingers 103a to 103d. As can be seen, two adjacent RF transistor fingers 103a to 103d of the RF switch 100 are not shorted with each other.

In the embodiment shown in FIG. 1a, a first RF gate area 121a is arranged between the first RF transistor finger 103a and the second RF transistor 103b, a second RF gate area 121b is arranged between the second RF transistor finger 103b and the third RF transistor finger 103c and a third RF gate area 121c is arranged between the third RF transistor finger 103c and the fourth RF transistor finger 103d.

Furthermore, the RF gate areas 121 to 121c are shorted. Hence, the RF gate areas 121 to 121c can form or can be connected to a control terminal 123 of the switchable RF transistor 101. The switchable RF transistor 101 is configured to switch between the high impedance state and the low impedance state of its switchable path in dependence on a potential applied to the RF gate areas 121a to 121c and therefore to the control terminal 123 of the switchable RF transistor 101.

In an embodiment of the present invention in which a plurality of such RF transistors 101 are coupled in series between the first signal terminal 115 and the second signal terminal 117, the RF switch 100 can be configured to provide to each control terminal 123 of the switchable RF transistors coupled in series the same potential for bringing in the first switch state of the RF switch 100 the switchable paths of the switchable RF transistors into the low impedance state and in the second switch state of the RF switch 100 the switchable paths of the switchable RF transistors into the high impedance state.

Figure 1B:
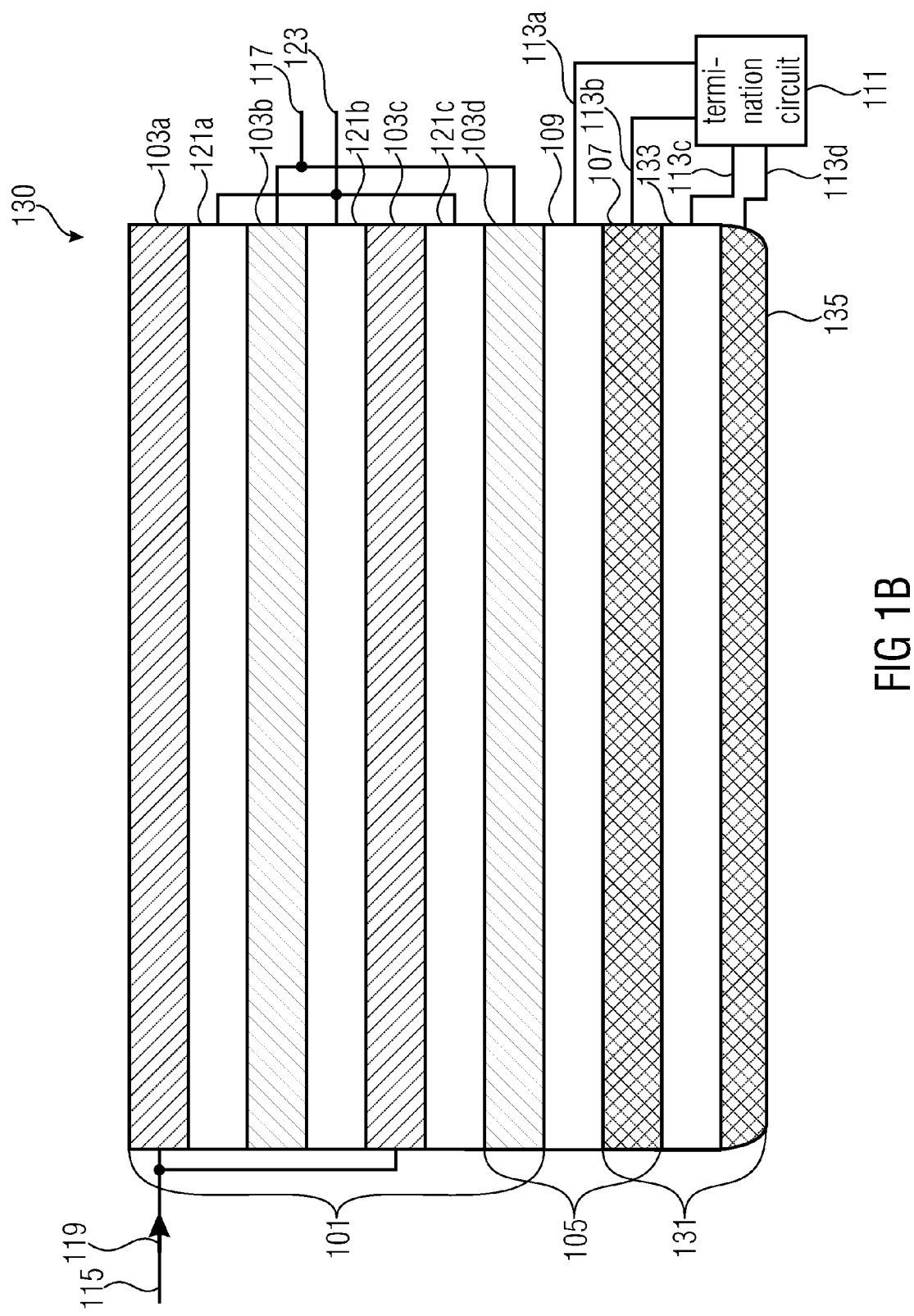
FIG. 1b shows an RF switch according to a further embodiment of the present invention.

FIG. 1b shows (in a top view perspective) an RF switch 130 according to a further embodiment of the present invention.

The RF switch 130 differs from the RF switch 100 in that it comprises a further non-switchable dummy transistor 131 which is arranged adjacent to the non-switchable dummy transistor 105.

Hence, the RF switch 130 comprises a further dummy transistor finger 135 which is arranged adjacent to the dummy transistor finger 107 and a further dummy gate area 133 which is arranged between the dummy transistor finger 107 and the further dummy transistor finger 135.

Furthermore, the termination circuit 111 is further configured to provide a third termination potential 113c to the further dummy gate area 133 and a fourth termination potential 113d to the further dummy transistor finger 135.

Hence, the further non-switchable dummy transistor 131 is formed by the dummy transistor finger 107, the further gate area 133 and the further dummy transistor 135.

The termination circuit 111 provides the termination potentials 113a to 113d such that during the operation of the RF switch 130 the impedance state of the non-switchable dummy 105 and furthermore the impedance state of the further non-switchable dummy transistor 131 are retained (stay constant).

Furthermore, the termination circuit 111 can be configured to provide the termination potentials 113a to 113d such that during the operation of the RF switch 130 the non-switchable dummy transistor 105 (or in more detail the switchable path of the non-switchable dummy transistor 105) stays in the high impedance state and such that the further non-switchable dummy transistor 131 (or in more detail a switchable path of the further non-switchable dummy transistor 131) stays in a low impedance state. Hence, the termination circuit 111 provides the termination potentials 113a to 113b such that the non-switchable dummy transistor 105 which is formed at least partly by the last RF transistor finger 103d stays in the high impedance state during the operation of the RF switch 130 while the further non-switchable dummy transistor 131 which is formed by the dummy transistor fingers 107, 135 (and not by any RF transistor finger 103a to 103d) stays in the low impedance state.

By having the non-switchable dummy transistor 105 in the high impendence state and the further non-switchable dummy transistor 131 in the low impendence state, a distribution of the high RF voltages which can occur at the last RF transistor finger 103d can be improved furthermore and therefore the robustness of the RF switch 130 can be improved furthermore.

According to further embodiments, the RF switch 130 may comprise further dummy gate areas and dummy transistor fingers which are arranged adjacent to the further dummy transistor finger 135 and which form further non-switchable dummy transistors. The termination circuit 111 may provide termination potentials to this additional dummy gate area and dummy transistor fingers such that the non-switchable dummy transistors formed by these additional dummy gate areas and dummy transistor fingers stay in a low impedance state during the operation of the RF switch 130.

Hence, the termination circuit 111 may provide the termination potentials to these additional dummy gate areas and/or dummy transistor fingers such that they are equal but may provide the first termination potential 113a which is provided to the dummy gate area 109 arranged between the last RF transistor finger 103d and the dummy transistor finger 107 such that the first termination potential 113a differs from the other termination potentials provided by the termination circuit 111.

Figure 1C:
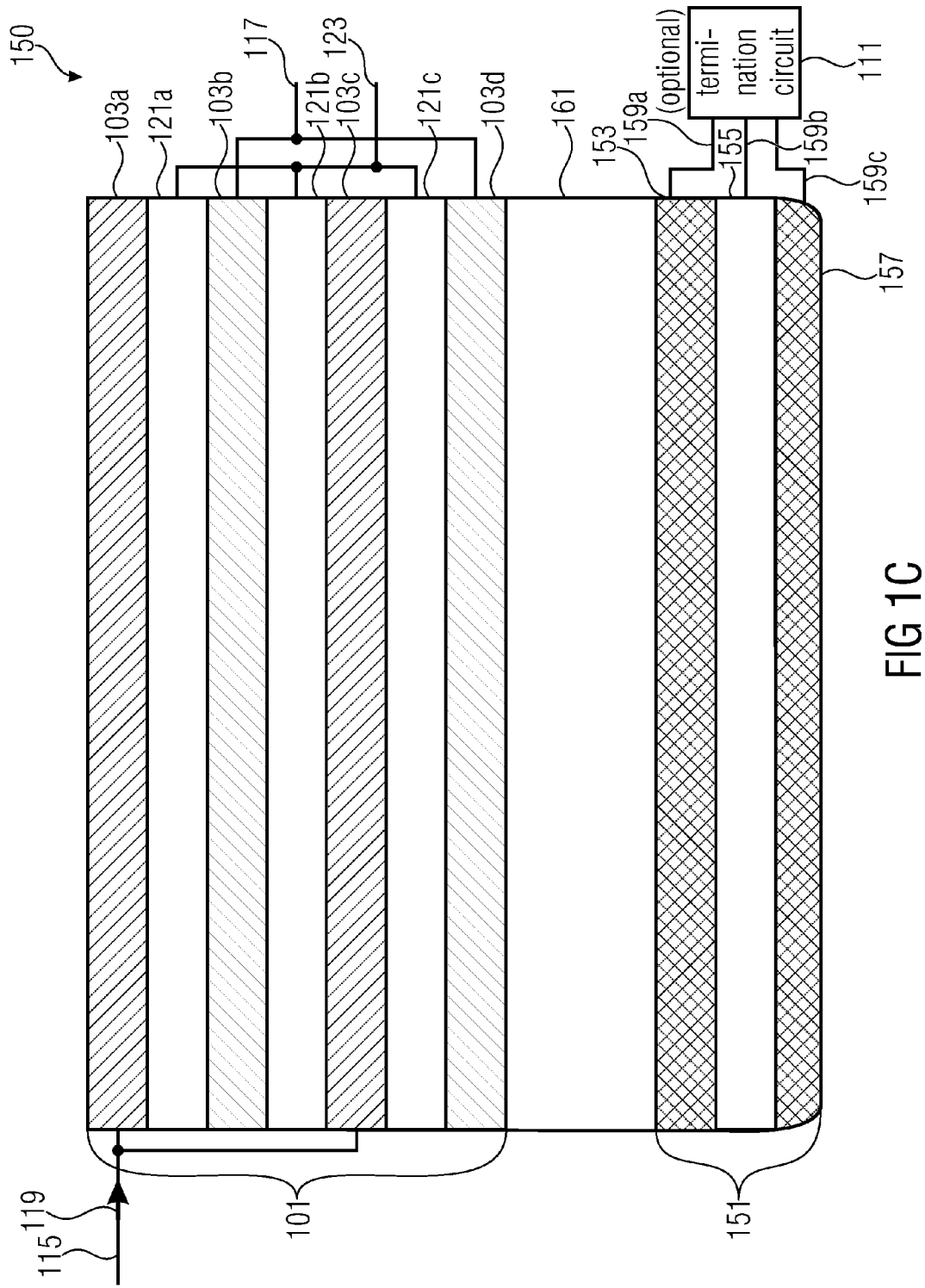
FIG. 1c shows an RF switch according to a further embodiment of the present invention.

FIG. 1c shows (in a top view perspective) an RF switch 100 according to a further embodiment of the present invention.

The RF switch 150 differs from the RF switch 100 shown in FIG. 1a in that a non-switchable dummy transistor 151 of the RF switch 150 is implemented differently when compared to the non-switchable dummy transistor 105 of the RF switch 100. In the RF switch 150 none of the RF transistor fingers 103a to 103d is part of the non-switchable dummy transistor 151. Instead, the RF switch 150 comprises a first dummy transistor finger 153, a first dummy gate area 155 and a second dummy transistor finger 157. The first dummy transistor finger 153 is arranged adjacent to the last RF transistor finger 103d. Furthermore, the dummy gate area 155 is arranged between the first dummy transistor finger 153 and the second dummy transistor finger 157.

The termination circuit 111 is configured to provide a first termination potential 159a to the first dummy transistor finger 153, a second termination potential 159b to the dummy gate area 155 and a third termination potential 159c to the second dummy transistor finger 157. As already described in conjunction with FIGS. 1a and 1b, the termination circuit 111 is configured to provide the termination potentials 159a to 159c such that during the operation of the RF switch 150 an impedance state of the non-switchable dummy transistor 151 is retained.

According to some embodiments of the present invention, the termination 111 provides the termination potentials 159a to 159c such that the non-switchable dummy transistor 151 (or in more detail a switchable path of the non-switchable dummy transistor 151) stays in a low impedance state during the operation of the RF switch 150. Hence, during the operation of the RF switch 150 and independent from the switch state of the RF switch 150 the switchable path of the non-switchable dummy transistor 151 stays in the low impedance state (e.g., conducting). As a result, during the operation of the RF switch 150 the first dummy transistor finger 153 and the second dummy transistor finger 157 are electrically coupled (via a low impedance path along the dummy gate area 155) with each other.

Furthermore, the RF switch 150 comprises a non-transistor area 161 which is arranged between the last RF transistor finger 103d and the first dummy transistor finger 153. The non-transistor area 161 is chosen such that during the operation of the RF switch 150 no low impedance path is established between the last RF transistor finger 103d and the first dummy transistor finger 153. In other words, the non-transistor area 161 is chosen such that it electrically decouples (e.g., isolates) the last RF transistor finger 103d and the first dummy transistor finger 153 from each other. In other words the non-transistor area 161 is chosen such that during the operation of the RF switch 150 the non-transistor area 161 stays in a high impedance state, without the need of applying a termination potential to the non-transistor area 161. Hence, according to some embodiments of the present invention, no termination potential is applied to the non-transistor area 161. The non-transistor area 161 is neither a diffusion region (such as drain or source) or a gate area of a transistor.

In other words, no switchable gate is arranged between the last RF transistor finger 103d and the first dummy transistor finger 153.

According to further embodiments of the present invention, a distance between the last RF transistor finger 103d and the first dummy transistor finger 153 is at least 10%, 20%, 50% or 100% larger than a distance between the last RF transistor finger 103d and the second to last RF transistor finger 103c.

In general, the distance between the last RF transistor finger 103d and the first dummy transistor finger 153 can be chosen such that the non-transistor area 161 between the last RF transistor finger 103d and the first dummy transistor 153 stays in the high impedance state during the operation of the RF switch 150.

To summarize, all of the RF switches 100, 130, 150 have in common that they comprise at least one dummy transistor finger 107, 153 which is arranged adjacent to the stripe of the switchable RF transistor 101. This dummy transistor finger 107, 153 is part of the non-switchable dummy transistor 105, 151 and is not shorted with any of the RF transistor fingers 103a to 103d of the switchable RF transistor 101.

Figure 1D:
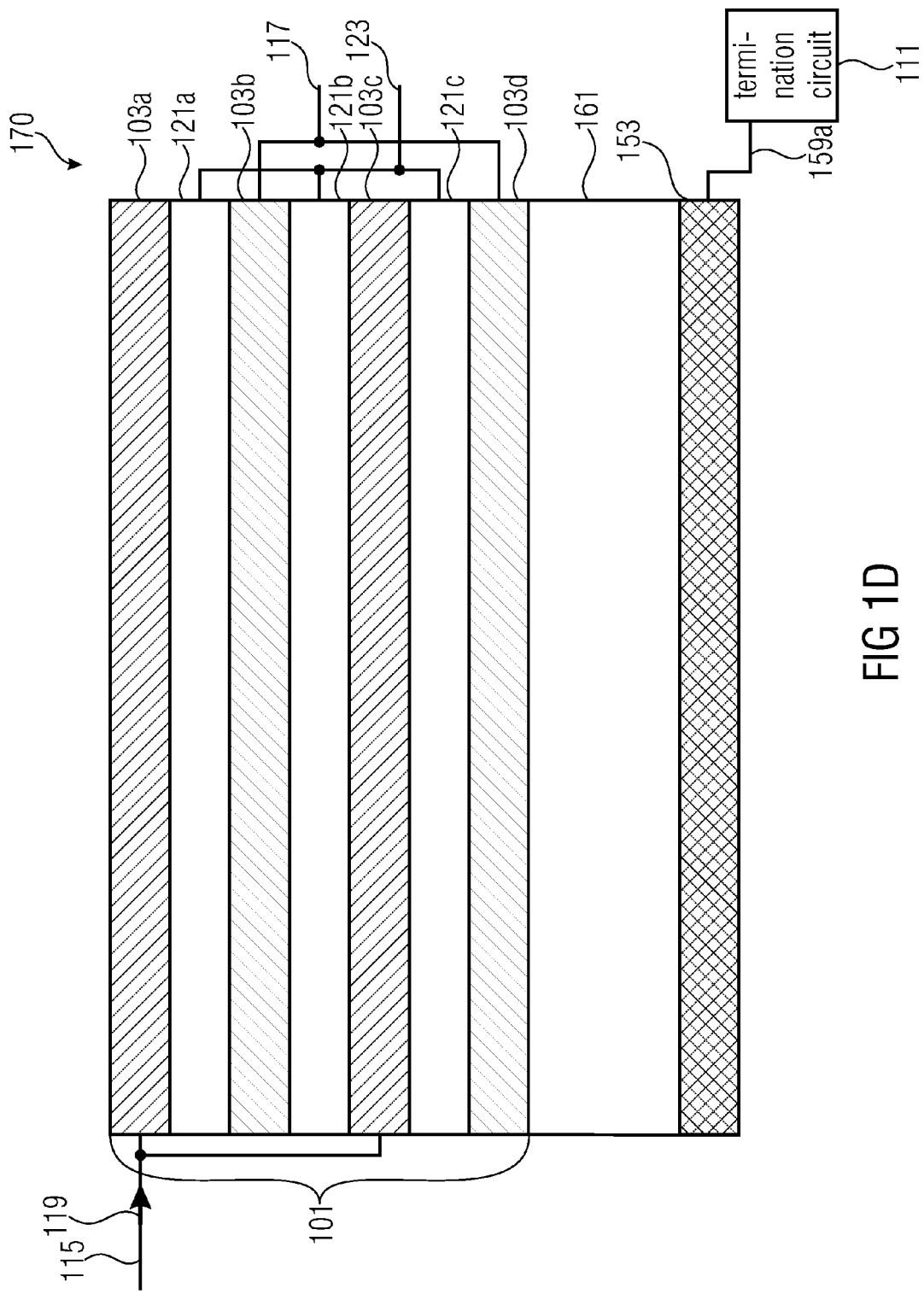
FIG. 1d shows an RF switch according to a further embodiment of the present invention.

FIG. 1d shows an RF switch 170 according to a further embodiment of the present invention. The RF switch 170 differs from the RF switch 150 in that the dummy gate area 155 and the second dummy transistor finger 157 have been omitted. Hence the, the RF switch 170 comprises the diffusion region 153 which is arranged at the end of the stripe of the switchable RF transistor 101, wherein the non-transistor area 161 is arranged between the switchable RF transistor 101 and the diffusion region 153. As already described in conjunction with the RF switch 150, the non-transistor area 161 and the termination potential 159a applied to the diffusion region 153 are chosen such that during operation of the RF switch 170 the non-transistor area 161 stays in a high impedance (e.g., non-conducting) state. It has been found that at least in some use cases it can be sufficient to distribute the high field strengths occurring at RF switches across a single diffusion region 153 arranged at the end of the stripe of the switchable RF transistor 101. Hence the RF switch 170 can be implemented with the less effort as possible, as only one additional diffusion region 153 is spend and additionally only on additional termination potential 159a is spend.

Figure 2A:
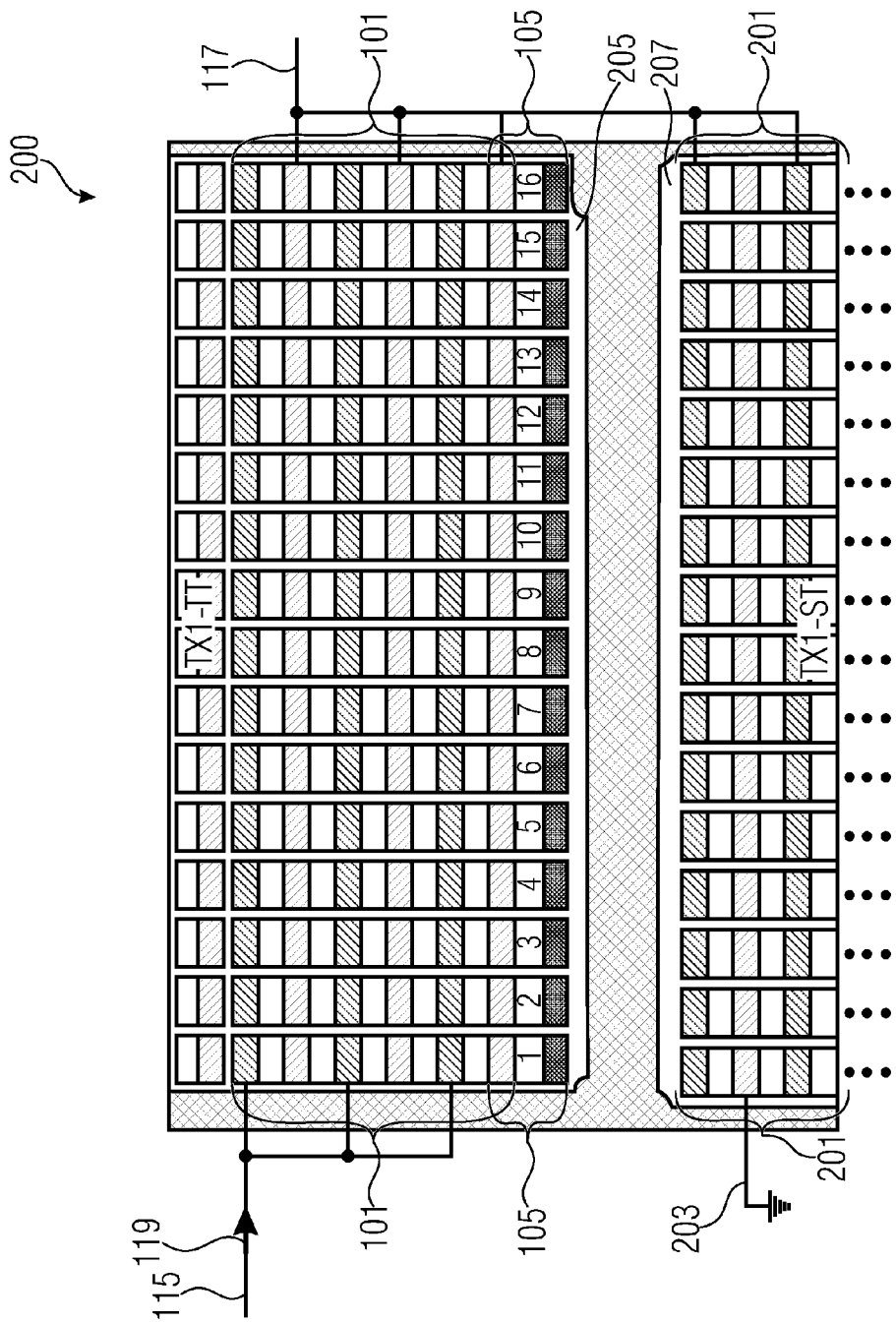
FIG. 2a shows an RF switch according to an embodiment of the present invention comprising a plurality of stacked RF transistors.

FIG. 2a shows (in a top view perspective) an RF switch 200 according to a further embodiment of the present invention. The RF switch 200 differs from the RF switch 100 shown in FIG. 1a in that it comprises a plurality of switchable RF transistors 101 which are coupled in series between the first signal terminal 115 and the second signal terminal 117 of the RF switch 200. Each of the switchable RF transistors 101 comprises a stripe of a plurality of adjacent RF transistor fingers, as described in conjunction with FIG. 1a. Furthermore, the RF switch 200 comprises a plurality of non-switchable dummy transistors 105. Each of the non-switchable dummy transistors 105 is arranged at an end of a strip of one of the switchable RF transistors 101 of the RF switch 200.

Although in the example shown in FIG. 2a, for each switchable RF transistor 101a non-switchable dummy transistor 105 is provided, according to further embodiments, the number of non-switchable dummy transistors 105 may differ from the number of switchable RF transistors 101. As an example, according to one embodiment of the present invention, it may be sufficient to provide one non-switchable dummy transistor 105 arranged at an end of a stripe of a first in series switchable RF transistor 101 in the series connection of switchable RF transistors 101.

As an example, according to an embodiment of the present invention, such a non-switchable dummy transistor 105 may be arranged at an end of a switchable RF transistor 101, an RF transistor finger of which is directly connected to the first signal terminal 115 of the RF switch 200. This may be sufficient, as typically the full RF voltage of a received or transmitted RF signal which is routed via the RF switch 200 is applied to one of the signal terminals 115, 117.

Although, the implementation of the RF switch 200 shown in FIG. 2a is based on the RF switch 100 in which the non-switchable dummy transistor 105 is formed by the last RF transistor finger 103d and the dummy transistor finger 107, according to further embodiments, the RF switch 200 may comprise further dummy transistors (such as the further dummy transistor 131) which are arranged adjacent to the dummy transistor 105 (as described in conjunction with FIG. 1b).

Furthermore, according to further embodiments of the preset invention, instead of having the dummy transistors 105 the RF switch 200 may comprise a plurality of non-switchable dummy transistors 151, as described in conjunction with FIG. 1c. Each of the dummy transistors 151 can be arranged at an end of a stripe of one of the switchable RF transistors 101. Furthermore, as already discussed above, according to some embodiments of the present invention, it may be sufficient to provide only for one or for some of the switchable RF transistors 101 such a non-switchable dummy transistor 151.

Furthermore, the RF switch 200 comprises the following additional features.

The RF switch 200 comprises a plurality of further switchable RF transistors 201 which are coupled in series between the second signal terminal 117 of the RF switch 200 and a ground potential terminal 203 of the RF switch 200. Each of the further switchable RF transistors 201 comprises a further stripe of a plurality of adjacent further RF transistor fingers.

As an example, the plurality of switchable RF transistors 101 which are coupled in series between the first signal terminal 1115 and the second signal terminal 117 form a through transistor or through path along which the RF signal 119 is switchably routed. A series connection of the further switchable RF transistors 201 coupled between the second signal terminal 117 and the ground potential terminal 203 forms a shunt path or shunt transistor of the RF switch 200.

The RF switch 200 is configured to in the first switch state of the RF switch 200 bring the switchable paths of the switchable RF transistors 101 into the low impedance state and to bring the switchable paths of the further switchable RF transistors 201 into the high impedance state. Furthermore, the RF switch 200 is configured to bring, in the second switch state of the RF switch 200, the switchable paths of the switchable RF transistors 101 into the high impedance state and the switchable paths of the further switchable RF transistors 201 into the low impedance state for establishing a shunt path between the second signal terminal 117 and the ground potential terminal 203. Although in the example shown in FIG. 2a, a plurality of switchable RF transistors 101 are coupled in series between the first signal terminal 115 and the second signal terminal 117 and, furthermore, a plurality of further switchable RF transistors 201 are coupled in series between the second signal terminal 117 and the ground potential terminal 203, according to a smallest embodiment of the present invention, it is sufficient to have at least one switchable RF transistor 101 coupled between the first signal terminal 115 and the second signal terminal 117 and at least one further switchable RF transistor 201 coupled between the second signal terminal 117 and the ground potential terminal 203.

In general, the number of switchable RF transistors 101 and the number of further switchable RF transistors 201 can be arbitrary and can depend on an amplitude of the RF signal 119 to be routed along the RF switch 200.

As can be seen from FIG. 2a, the plurality of switchable RF transistors 101 and the further switchable RF transistors 201 are arranged on opposite sides of the non-switchable dummy transistors 105.

By having the non-switchable dummy transistors 105 arranged between the switchable RF transistors 101 and the further switchable RF transistors 201, it can be prevented that a high field strength occurs between the last or second to last RF transistor fingers of the switchable RF transistors 101 and the further RF transistor fingers of the further switchable RF transistors 201. Hence, by reducing the field strength between these RF transistor fingers of the different switchable RF transistors 101, 201, the robustness of the RF switch 200 can be improved when compared to systems in which the RF transistor fingers of switchable RF transistors of a through pass and the RF transistor fingers of further switchable RF transistors of a shunt pass are arranged facing each other without an additional dummy transistor in between.

Hence, embodiments provide a more robust RF switch, especially in cases in which a full RF voltage is provided to at least transistor fingers of the first in series switchable RF transistor 101 and a ground potential is provided to the transistor fingers of the further switchable RF transistors 201 coupled to the ground potential terminal 203.

As an example, every second further RF transistor finger of a further switchable RF transistor 201, which is in the series connection between the second signal terminal 117 and the ground potential terminal 203, a last further switchable RF transistor 201 is directly connected to the ground potential terminal 203.

Furthermore, each of the further switchable RF transistors 201 comprises a plurality of further RF gate areas, wherein a further RF gate area is arranged between a pair of the further RF transistor fingers of the further switchable RF transistor 201. Furthermore, the further RF gate areas of a further switchable RF transistor 201 are shorted.

The RF switch 200 can be configured to provide to the further RF gate areas of the further switchable RF transistors 201a gate potential for switching the further switchable RF transistors 201 between their high impedance states and their low impedance states.

Furthermore, as can be seen in FIG. 2a, the switchable RF transistors 101 can be arranged in a first well or first depletion region 205 and the further switchable RF transistors 201 can be arranged in a second well or second depletion region 207 which is separated from the first well or first depletion region 205.

Nevertheless, according to further embodiments of the present invention, the switchable RF transistors 101 and the further switchable RF transistors 201 may be also implemented in one and the same well or depletion region.

Figure 2B:
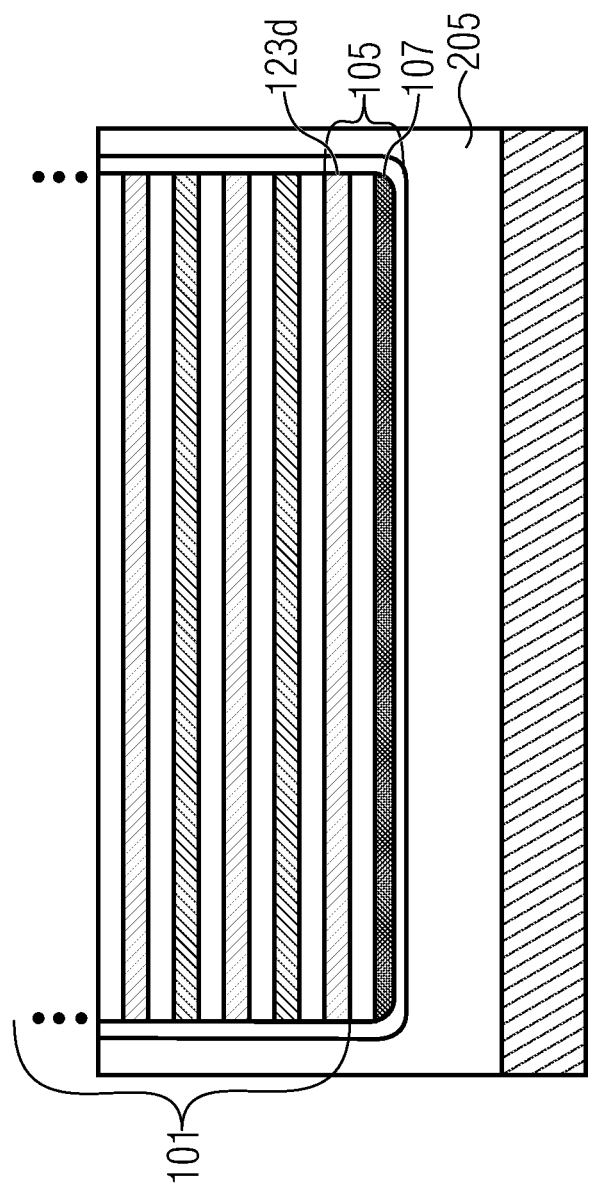

FIG. 2b shows in an enlarged scale one of the switchable RF transistors 101 together with a non-switchable dummy transistor 105 arranged at an end of the stripe of the switchable RF transistor 101 from the RF switch 200.

It can be seen that, in accordance to some embodiments of the present invention, at least one dummy transistor finger 107 is provided between a boundary of a well 205 or diffusion region 205 of the switchable RF transistor 101 and the last RF transistor finger 123d of the switchable RF transistor 101. Hence, the voltage difference between the last RF transistor finger 123d and a substrate of the switchable RF transistor 101 can be distributed on the dummy transistor finger 107, which reduces the field strength occurring between the last RF transistor finger 123d and the boundary of the well 205 and therefore increases the robustness of the RF switch 200.

Figure 2C:
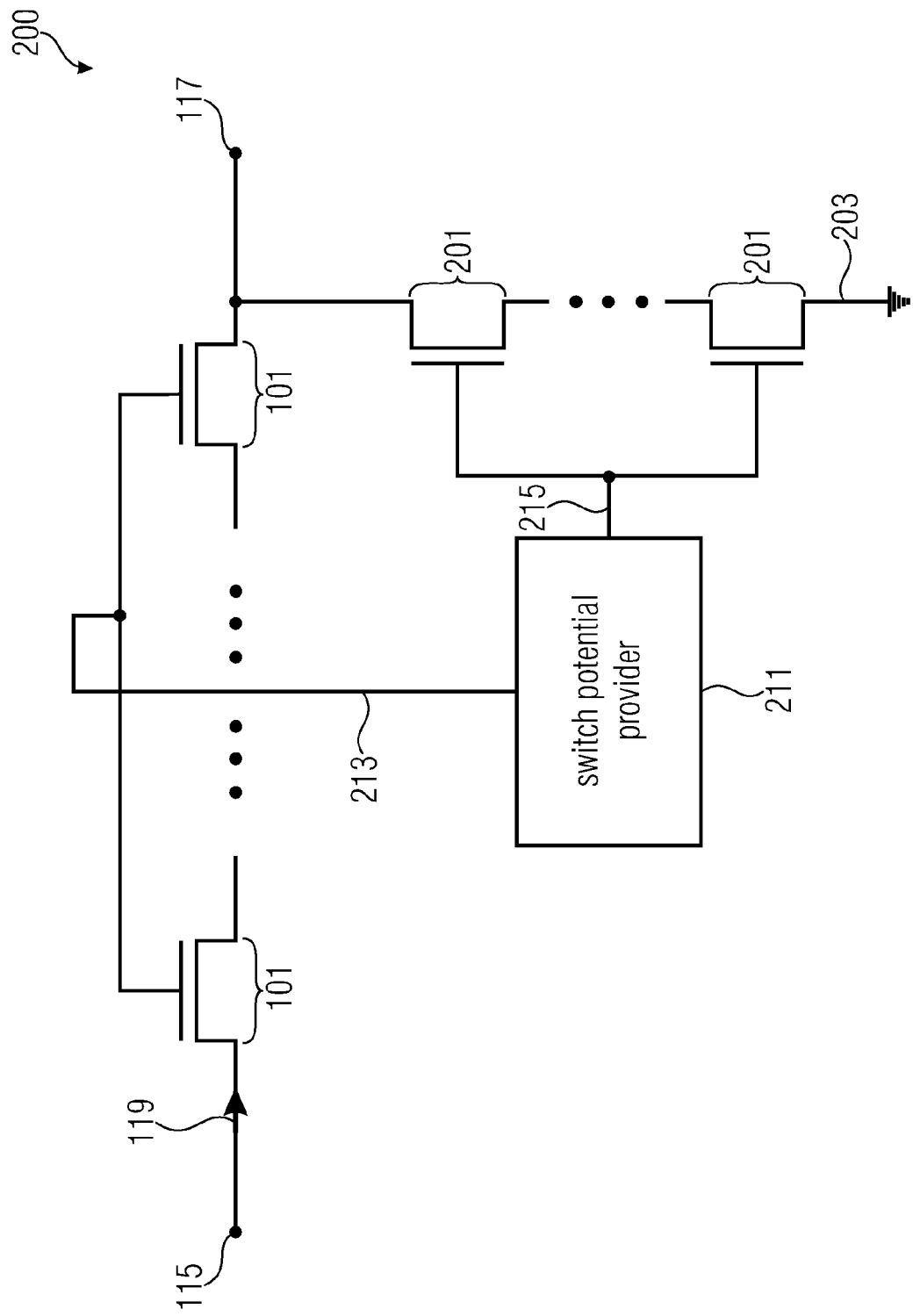
FIG. 2c shows a schematic of a circuit of an RF switch.

FIG. 2c shows in a schematic the circuit of the RF switch 200. From FIG. 2c it can be seen that the plurality of switchable RF transistors 101 are coupled in series between the first signal terminal 115 and the second signal terminal 117 and, furthermore, it can be seen that the plurality of further switchable RF transistors 201 are coupled in series between the second signal terminal 117 and the ground potential terminal 203. Furthermore, the RF switch 200 comprises a switch potential provider 211 which is configured to provide a first switch potential 213 to the switchable RF transistors 101 (for example, to gate terminals of the switchable RF transistors 101) and to provide a second switch potential to the further switchable RF transistors 201 (for example, to gate terminals of the further switchable RF transistors 201).

The switch potential provider 211 is configured to provide in the first switch state of the RF switch 200 the first switch potential 213 such that the switchable RF transistors 101 are in the low impedance state (such that the RF signal 119 can be routed from the first signal terminal 115 to the second signal terminal 117 or vice versa). Furthermore, the switch potential provider 211 is configured to provide in the first switch state of the RF switch 200 the second switch potential 215 such that the further switchable RF transistor 201 are in their high impedance state.

Furthermore, the switch potential provider 211 is configured to provide in the second switch state of the RF switch 200 the first switch potential 213 such that the switchable RF transistors 101 are in their high impedance state and the second switch potential 215 such that the further switchable RF transistors 201 are in their low impedance state.

As already described, the number of switchable RF transistors 101 and of the further switchable RF transistors 201 is arbitrary and can depend on the RF signal 119 to be routed along the RF switch 200.

In the following, different possible implementations for the termination circuit 111 will be shown.

Figure 3A:
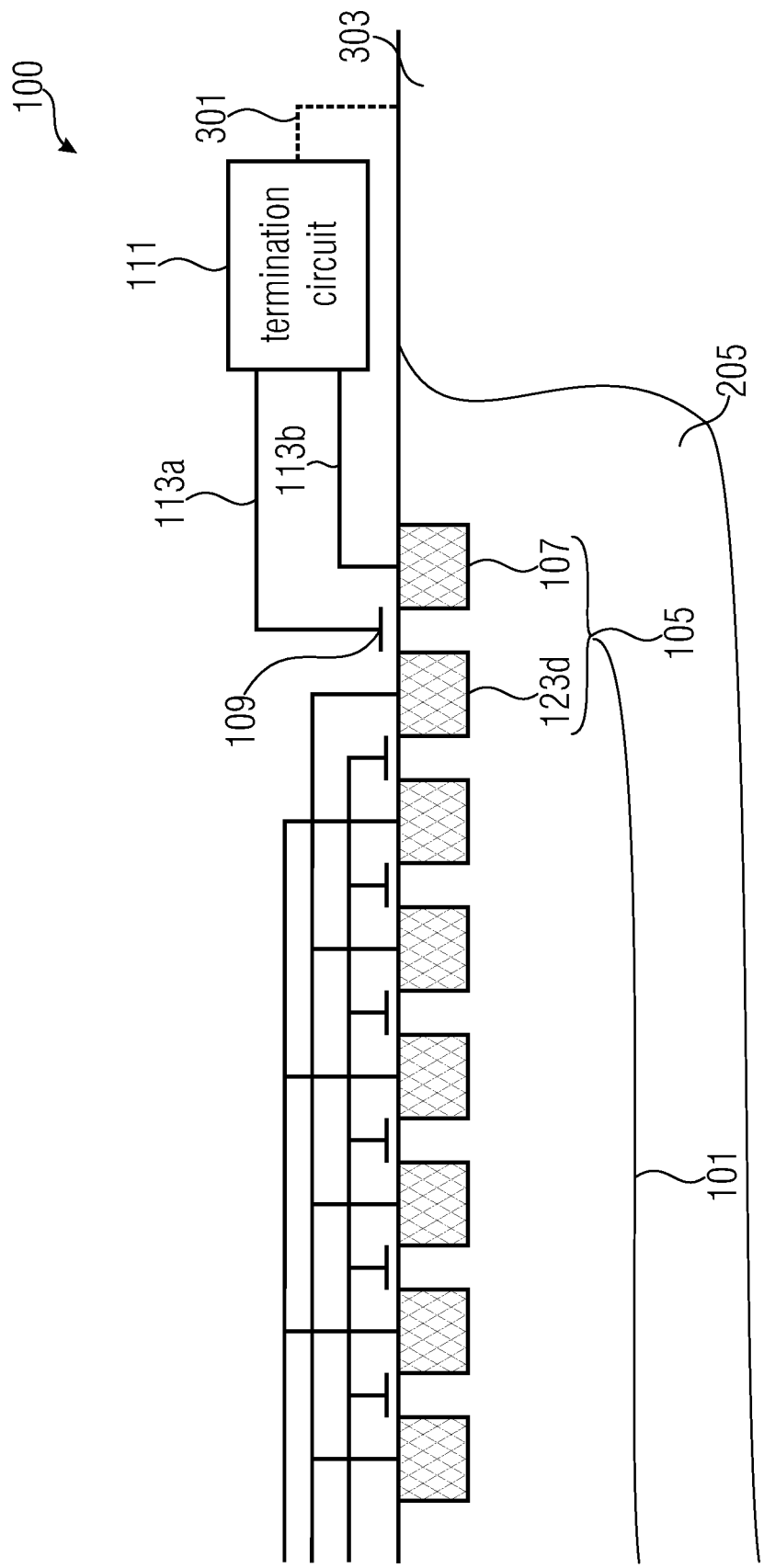

FIG. 3a shows a first possible implementation for the termination circuit 111 as it can be used in the RF switch 100. In the example shown in FIG. 3a the termination circuit 111 is configured to provide the first termination potential 113a to the dummy gate area 109 and the second termination potential 113b to the dummy transistor finger 107. The termination circuit 111 can provide the first termination potential 113a independent from the second termination potential 113b. In other words, the termination circuit 111 is configured to provide the first termination potential 113a and the second termination potential 113b such that they can differ from each other.

Furthermore, the termination circuit 111 can be configured to provide a biasing potential 301 to a substrate 303 of the RF switch 100. The termination circuit 111 can be configured to provide the biasing potential 301 such that a magnitude of the biasing potential 301 is larger than a magnitude of one of the termination potentials 113a, 113b or even larger than the magnitudes of both termination potentials 113a, 113b. As an example, the biasing potential and the termination potential (or a biasing voltage and a termination voltage with regard to a ground potential) can be negative.

As already described, the termination circuit 111 can be configured to provide the termination potentials 113a, 113b such that during the operation of the RF switch 100 the non-switchable dummy transistor 105 stays in its high impedance state.

Figure 3B:
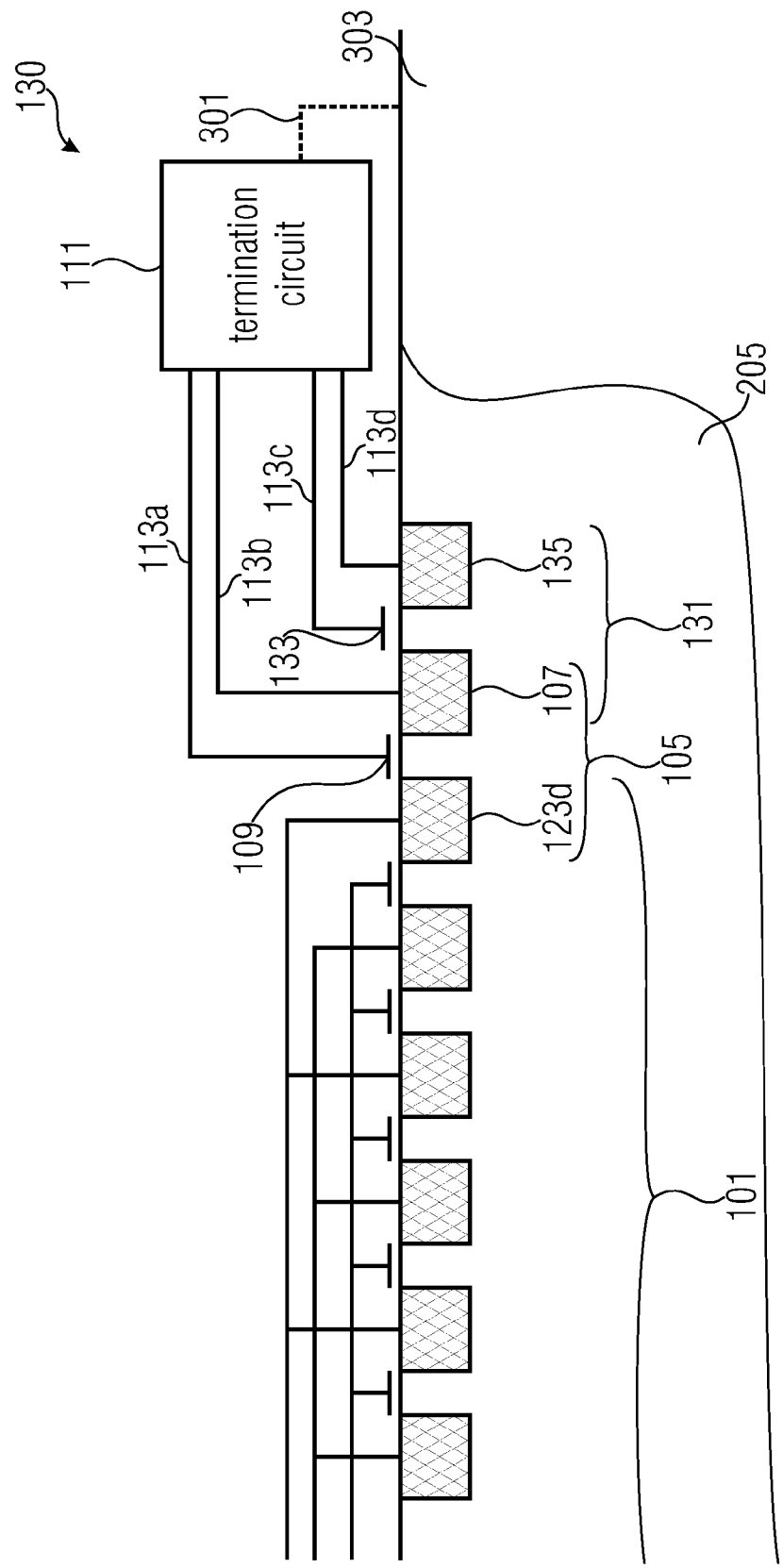

FIG. 3b shows a possible implementation of a termination circuit 111 for the RF switch 130 shown in FIG. 1b. As can be seen from FIG. 3b the termination circuit 111 is configured to provide the four termination potentials 113a to 113d. The termination circuit 111 can be configured to provide the four termination potentials 113a to 113d independent from each other, i.e., such that they can differ from each other.

Furthermore, the termination circuit 111 can be configured to provide the termination potentials 113a to 113d such that during the operation of the RF switch 130 the dummy transistor 105 stays in its high impedance state and the further dummy transistor 131 stays in its low impedance state.

The termination potentials provided by the termination circuit 111 can be provided using resistors or impedances. Two different implementations for the termination circuit 111 shown in FIG. 3a using such resistors or impedances will be shown in FIGS. 3c and 3d.

FIG. 3c shows an implementation of the termination circuit 111 in which the dummy gate area 109 and the dummy transistor finger 107 are terminated using two separate pre-resistors 305a, 305b. Hence, the first termination potential 113a can be different from the second termination potential 113b. As the dummy gate area 109 and the dummy transistor finger 107 are RF coupled by means of capacitances, the desired effect achieved by embodiments of the present invention is stronger for this wiring shown in FIG. 3c having the two pre-resistors 305a, 305b when compared to a system in which one pre-resistor is used for providing both the first termination potential 113a and the second termination potential 113b, since RF voltage can also drop across these capacitances. Nevertheless, using just one common pre-resistor for the dummy gate area 109 and the dummy transistor finger 107 has the advantage of less effort. Hence, FIG. 3d shows such a wiring for the termination circuit 111 in which the dummy gate area 109 and the dummy transistor finger 107 are combined and connected to one and the same pre-resistor 305a in order to save the additional pre-resistor 305b.

Figure 3D:
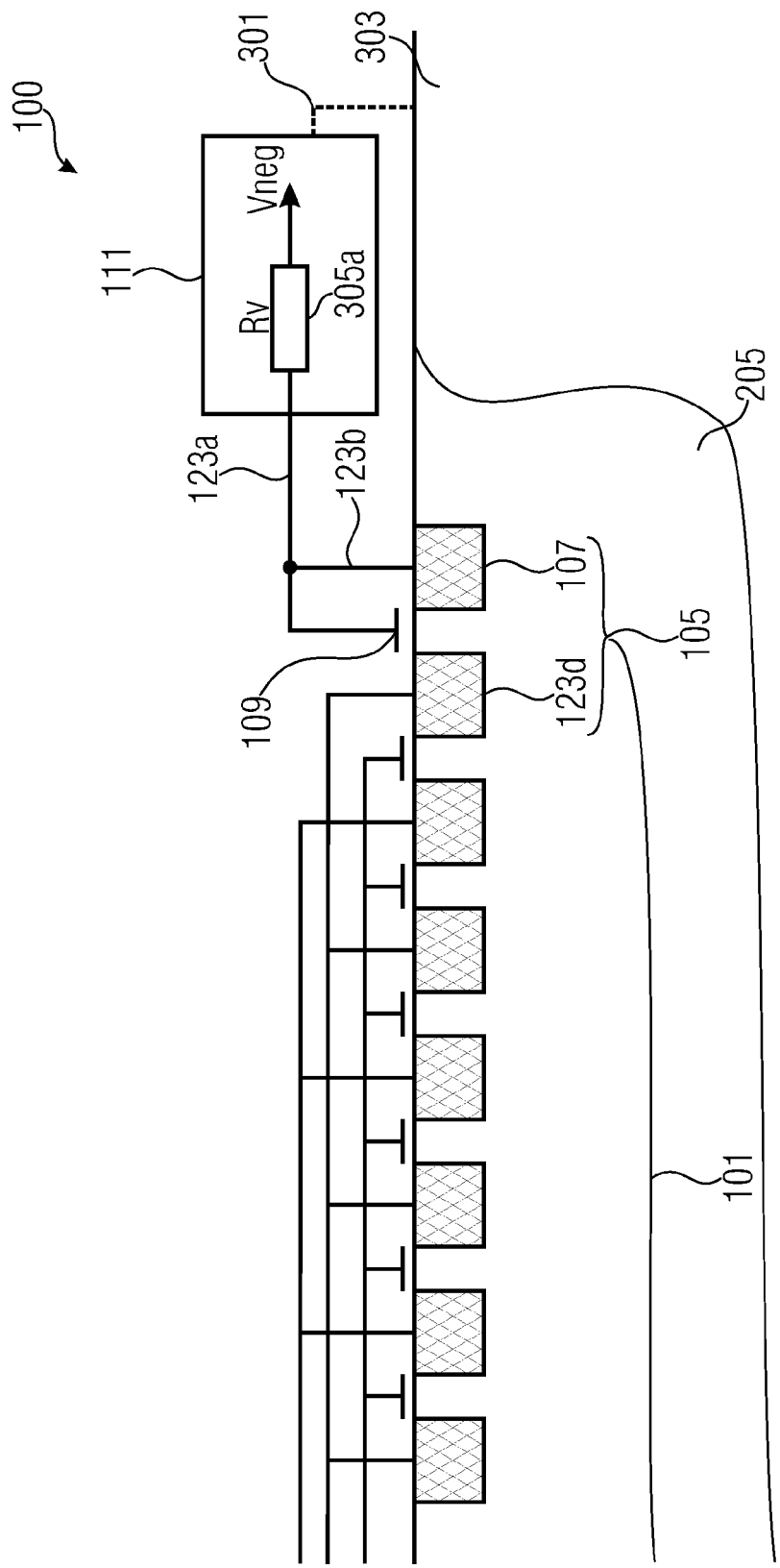

Hence, in the implementation shown in FIG. 3d, the termination circuit 111 is configured to provide the first termination potential 123a and the second termination potential 123b such that they are equal.

In all cases, it is advisable to choose a voltage Vneg for the termination potentials 123a, 123b such that the non-switchable dummy transistor 105 (formed by the last RF transistor finger 123d and the dummy transistor finger or edge transistor finger 107) is non-conductive.

To summarize, it is a basic idea of embodiments of the present invention to distribute the high RF voltages across several dummy transistor fingers. FIG. 1a shows an example with one edge finger or dummy transistor 107, however, several dummy transistor fingers 107, 135, 155, 157 can be used as shown in FIGS. 1b, 1c and 3b with the example of two dummy transistor fingers or edge fingers 107, 135, 153, 157.

The termination potentials 113a to 113d provided by the termination circuit 111 can be fixed potentials (e.g., having a ripple of at maximum 1% of its amplitude). In other words, the termination potential 113a to 113d provided by the termination circuit 111 can be DC signals having a constant amplitude or potential.

It has been found that the more dummy transistor fingers are used, the higher the desired effect. However, the effort increases with every further finger. Thus, the number of dummy transistor fingers should be limited as far as possible. Hence, according to some embodiments of the present invention, only one dummy transistor finger can be sufficient. Furthermore, it has been found that the type of termination (the connection of the dummy transistor fingers and the dummy gate areas to the termination circuit 111) has a large influence on the effects of this measure and the effort that has to be taken. Hence, different implementations with different terminations have been provided in conjunction with FIGS. 3a to 3d.

To summarize, embodiments of the present invention provide a possible solution for existing and not yet solved problems with the robustness of RF switches. Furthermore, a layout dependency can be reduced when compared to conventional systems.

FIG. 4 shows a block schematic diagram of a mobile communication device 400 according to a further embodiment of the present invention. The mobile communication device 400 comprises an antenna 401, an RF switch 403 and a receiver or transmitter 405, the receiver or transmitter 405 comprising a digital baseband processor 407.

The RF switch 403 is coupled between the antenna 401 and the receiver or transmitter 405. As an example, the RF switch 403 may be one of the RF switches described in the present application or any other RF switch according to an embodiment of the present invention.

As an example, the RF switch 403 is configured to switchably route an RF signal from the antenna 401 to the receiver or transmitter 405 or from the receiver or transmitter 405 to the antenna 401.

The mobile communication device 400 may be a portable mobile communication device.

As an example, the mobile communication device 400 can be configured to perform a voice and/or data communication (according to a mobile communication standard) with another (portable) mobile communication device and/or a mobile communication base station. Such a mobile communication device may be, for example, a mobile headset such as a mobile phone (cell phone), a so called smart phone, a tablet PC, a broadband modem, a notebook or a laptop, as well as a router or a PC.

Figure 5:
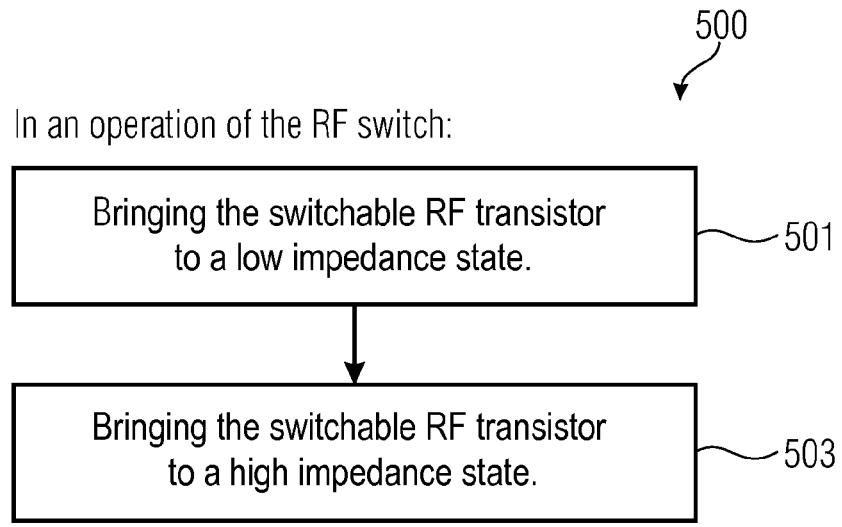
FIG. 5 shows a flow diagram of a method for switching an RF signal according to an embodiment of the present invention.

FIG. 5 shows a flow diagram of a method 500 for switching an RF signal using an RF switch according to an embodiment of the present invention. The RF switch comprises a switchable RF transistor, wherein the switchable RF transistor comprises a stripe of a plurality of adjacent RF transistor fingers and wherein the RF switch further comprises at least one non-switchable dummy transistor which is arranged at an end of the stripe of the switchable RF transistor. Hence, the method 500 is a method for switching an RF signal using an RF switch as described in the present application or any other RF switch according to an embodiment of the present invention.

The method 500 comprises a step 501 of bringing the switchable RF transistor in a low impedance state.

Furthermore, the method 500 comprises a step 503 of bringing the switchable RF transistor in a high impedance state. The step 501 and the step 503 are performed in an operation of the RF switch and, furthermore, during the operation of the RF switch, the impedance state of the non-switchable dummy transistor is retained.

In other words, although during the operation of the RF switch a switch state of the switchable RF transistor is changed; a switch state of the non-switchable dummy transistor is retained (not changed).

Figure 6:
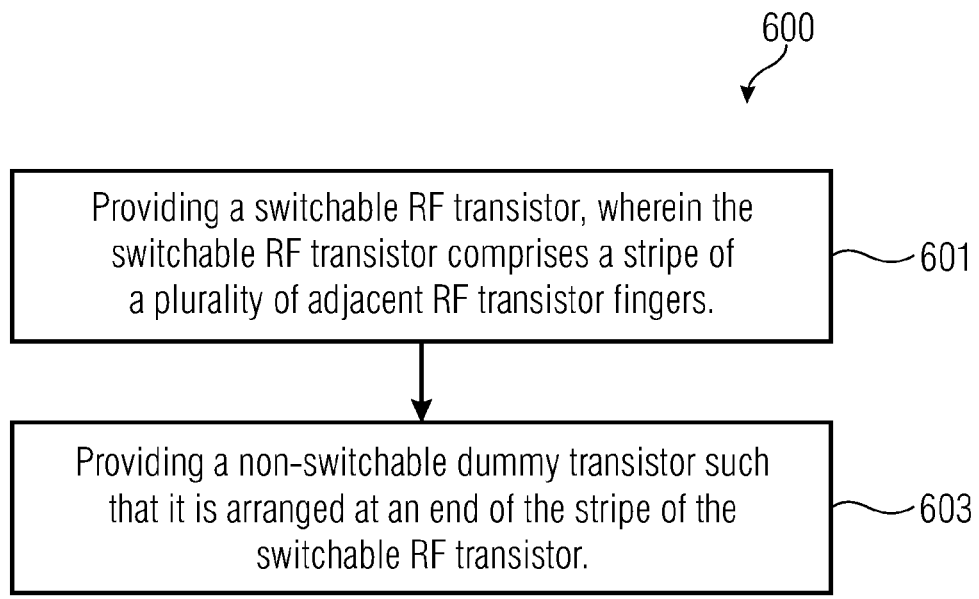
FIG. 6 shows a flow diagram of a method for manufacturing an RF switch according to an embodiment of the present invention.

FIG. 6 shows a method 600 for manufacturing an RF switch according to an embodiment of the present invention.

The method 600 comprises a step 601 of providing a switchable RF transistor, wherein the switchable RF transistor comprises a stripe of a plurality of adjacent RF transistor fingers.

Furthermore, the method 600 comprises a step 603 of providing a non-switchable dummy transistor such that it is arranged at an end of the stripe of the switchable RF transistor.

The methods 500, 600 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:
1. An RF switch comprising:
a switchable RF transistor, wherein the switchable RF transistor comprises a stripe of a plurality of adjacent RF transistor fingers; and
a non-switchable dummy transistor arranged at an end of the stripe of the switchable RF transistor.

2. The RF switch according to claim 1, further comprising a termination circuit configured to provide a termination potential to the non-switchable dummy transistor for retaining an impedance state of the non-switchable dummy transistor.

3. The RF switch according to claim 2, wherein the termination circuit is further configured to provide a biasing potential to a substrate of the RF switch, such that a magnitude of the biasing potential is larger than a magnitude of the termination potential.

4. The RF switch according to claim 1,
wherein the non-switchable dummy transistor is formed by a last RF transistor finger of the stripe, a dummy transistor finger arranged adjacent to the last RF transistor finger and a dummy gate area arranged between the last RF transistor finger and the dummy transistor finger; and
wherein the RF switch further comprises a termination circuit configured to provide a first termination potential to the dummy gate area and a second termination potential to the dummy transistor finger for retaining an impedance state of the non-switchable dummy transistor.

5. The RF switch according to claim 4, wherein the first termination potential and the second termination potential are chosen such that the non-switchable dummy transistor stays in a high impedance state during operation of the RF switch.

6. The RF switch according to claim 5, wherein the first termination potential and the second termination potential are equal.

7. The RF switch according to claim 4,
further comprising a further non-switchable dummy transistor formed by the dummy transistor finger, a further dummy transistor finger arranged adjacent to the dummy transistor finger and a further dummy gate area arranged between the dummy transistor finger and the further dummy transistor finger; and
wherein the termination circuit is further configured to provide a third termination potential to the further dummy gate area and a fourth termination potential to the further dummy transistor finger for retaining an impedance state of the further non-switchable dummy transistor.

8. The RF switch according to claim 7, wherein the first, second, third, and fourth termination potentials are chosen such that the non-switchable dummy transistor stays in a high impedance state during operation of the RF switch and the further non-switchable dummy transistor stays in a low impedance state during operation of the RF switch.

9. The RF switch according to claim 1, further comprising:
a termination circuit;
wherein the non-switchable dummy transistor is formed by a first dummy transistor finger arranged adjacent to a last RF transistor finger of the stripe, a second dummy transistor finger arranged adjacent to the first dummy transistor finger and a dummy gate area arranged between the first dummy transistor finger and the second dummy transistor finger; and
wherein the termination circuit is configured to provide a first termination potential to the first dummy transistor finger, a second termination potential to the dummy gate area and a third termination potential to the second dummy transistor finger.

10. The RF switch according to claim 9, wherein the first termination potential, the second termination potential and the third termination potential are chosen such that the non-switchable dummy transistor stays in a low impedance state during operation of the RF switch.

11. The RF switch according to claim 9, further comprising a non-transistor area arranged between the last RF transistor finger and the first dummy transistor finger, wherein the non-transistor area is chosen such that the non-transistor area stays in a high impedance state during an operation of the RF switch.

12. The RF switch according to claim 9, wherein a distance between the last RF transistor finger and the first dummy transistor finger is at least 20% larger than a distance between the last RF transistor finger and a second to last RF transistor finger in the stripe.

13. The RF switch according to claim 1, wherein each of the RF transistor fingers of the switchable RF transistor is shorted with a penultimate in the stripe of RF transistor fingers of the switchable RF transistor.

14. The RF switch according to claim 1, further comprising a plurality of RF gate areas, wherein an RF gate area of the plurality of RF gate areas is arranged between a pair of adjacent RF transistor fingers of the switchable RF transistor and wherein the RF gate areas are shorted.

15. The RF switch according to claim 1, further comprising a dummy transistor finger arranged adjacent to the stripe, wherein the dummy transistor finger is part of the non-switchable dummy transistor and is not shorted with any of the RF transistor fingers of the switchable RF transistor.

16. The RF switch according to claim 1, wherein the switchable RF transistor is coupled between a first signal terminal of the RF switch and a second signal terminal of the RF switch for routing in a low impedance state of the switchable RF transistor an RF signal from the first signal terminal to the second signal terminal or vice versa.

17. The RF switch according to claim 16, further comprising a further switchable RF transistor coupled between the second signal terminal of the RF switch and a ground potential terminal of the RF switch, wherein the further switchable RF transistor comprises a further stripe of a plurality of adjacent further RF transistor fingers.

18. The RF switch according to claim 17, wherein the further switchable RF transistor and the switchable RF transistor are arranged on opposite sides of the non-switchable dummy transistor.

19. The RF switch according to claim 17, wherein every second further RF transistor finger of the further switchable RF transistor is directly connected to the ground potential terminal.

20. The RF switch according to claim 17, further comprising a plurality of further RF gate areas, wherein a further RF gate area of the plurality of further RF gate areas is arranged between a pair of the further RF transistor fingers of the further switchable RF transistor and wherein the further RF gate areas are shorted.

21. The RF switch according to claim 17, wherein the RF transistor fingers are arranged in a first well or first depletion region and the further RF transistor fingers are arranged in a second well or second depletion region, which is separated from the first well or first depletion region.

22. The RF switch according to claim 1, further comprising:
a first signal terminal;
a second signal terminal;
a ground potential terminal;
a further switchable RF transistor coupled between the second signal terminal and the ground potential terminal and configured to provide, in a low impedance state of the further switchable RF transistor, a ground potential at the second signal terminal; and
a switch potential provider configured to provide a first switch potential to the switchable RF transistor and a second switch potential to the further switchable RF transistor;
wherein the switchable RF transistor is coupled between the first signal terminal and the second signal terminal for routing in a low impedance state of the switchable RF transistor an RF signal from the first signal terminal to the second signal terminal or vice versa;
wherein the switch potential provider is configured to provide in a first switch state of the RF switch the first switch potential such that the switchable RF transistor is in the low impedance state and the second switch potential such that the further switchable RF transistor is in a high impedance state; and
wherein the switch potential provider is further configured to provide in a second switch state of the RF switch the first switch potential such that the switchable RF transistor is in the high impedance state and the second switch potential such that the further switchable RF transistor is in the low impedance state.

23. An RF switch comprising:
a switchable RF transistor, wherein the switchable RF transistor comprises a stripe of a plurality of adjacent RF transistor fingers;
a non-switchable dummy transistor arranged at an end of the stripe of the switchable RF transistor;
a termination circuit;
a first signal terminal; and
a second signal terminal;
wherein the non-switchable dummy transistor is formed by a last RF transistor finger of the stripe, a dummy transistor finger arranged adjacent to the last RF transistor finger and a dummy gate area arranged between the last RF transistor finger and the dummy transistor finger;
wherein the termination circuit is configured to provide a first termination potential to the dummy gate area and a second termination potential to the dummy transistor finger such that the non-switchable dummy transistor stays in a high impedance state during operation of the RF switch; and
wherein the switchable RF transistor is coupled between the first signal terminal of the RF switch and the second signal terminal of the RF switch for routing in a low impedance state of the switchable RF transistor an RF signal from the first signal terminal to the second signal terminal or vice versa.

24. A method for switching an RF signal using an RF switch, the RF switch comprising a switchable RF transistor that comprises a stripe of a plurality of adjacent RF transistor fingers, and wherein the RF switch further comprises a non-switchable dummy transistor arranged at an end of the stripe of the switchable RF transistor, the method comprising:
during operating of the RF switch, bringing the switchable RF transistor to a low impedance state; and
during operating of the RF switch, bringing the switchable RF transistor to a high impedance state;
wherein during the operation of the RF switch an impedance state of the non-switchable dummy transistor is retained.

25. A method for manufacturing an RF switch, the method comprising:
providing a switchable RF transistor, wherein the switchable RF transistor comprises a stripe of a plurality of adjacent RF transistor fingers; and
providing a non-switchable dummy transistor at an end of the stripe of the switchable RF transistor.

26. A mobile communication device comprising:
an antenna;
an RF switch comprising:
a switchable RF transistor, wherein the switchable RF transistor comprises a stripe of a plurality of adjacent RF transistor fingers; and
a non-switchable dummy transistor arranged at an end of the stripe of the switchable RF transistor; and
a receiver or transmitter comprising a digital base band processor, wherein the RF switch is coupled between the antenna and the receiver or transmitter.

27. An RF switch comprising:
- a switchable RF transistor, wherein the switchable RF transistor comprises a stripe of a plurality of adjacent RF transistor fingers;
- a diffusion region arranged at an end of the stripe of the switchable RF transistor;
- a non-transistor area arranged between a last RF transistor finger of the stripe of the switchable RF transistor and the diffusion region; and
- a termination circuit configured to provide a termination potential to the diffusion region, wherein the termination potential and the non-transistor area are chosen such that during operation of the RF switch, the non-transistor area stays in a high impedance state.

* * * * *